United States Patent
Johnson et al.

(10) Patent No.: US 10,684,555 B2
(45) Date of Patent: Jun. 16, 2020

(54) SPATIAL LIGHT MODULATOR WITH VARIABLE INTENSITY DIODES

(71) Applicant: Applied Materials, Inc., Santa Clara, CA (US)

(72) Inventors: Joseph R. Johnson, Redwood City, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 7 days.

(21) Appl. No.: 15/933,147

(22) Filed: Mar. 22, 2018

(65) Prior Publication Data
US 2019/0294051 A1 Sep. 26, 2019

(51) Int. Cl.
| | |
|---|---|
| G03F 7/20 | (2006.01) |
| G03F 7/00 | (2006.01) |
| H01S 5/30 | (2006.01) |
| H01L 27/15 | (2006.01) |
| H01L 33/32 | (2010.01) |
| H01S 5/40 | (2006.01) |
| H01S 5/026 | (2006.01) |

(52) U.S. Cl.
CPC ........ *G03F 7/70391* (2013.01); *G03F 7/0007* (2013.01); *G03F 7/704* (2013.01); *G03F 7/70008* (2013.01); *G03F 7/7055* (2013.01); *G03F 7/70383* (2013.01); *G03F 7/70475* (2013.01); *G03F 7/70558* (2013.01); *H01L 27/156* (2013.01); *H01L 33/32* (2013.01); *H01S 5/026* (2013.01); *H01S 5/3013* (2013.01); *H01S 5/4025* (2013.01)

(58) Field of Classification Search
CPC .. G03F 7/0007; G03F 7/0008; G03F 7/70275; G03F 7/70383; G03F 7/70391; G03F 7/704; G03F 7/70475; G03F 7/7055; G03F 7/70558; H01L 27/156; H01L 33/32; H01S 5/026; H01S 5/3013; H01S 5/4025
USPC ........................................ 355/53, 67, 69, 77
See application file for complete search history.

(56) References Cited

U.S. PATENT DOCUMENTS

| | | |
|---|---|---|
| 2005/0181314 A1 | 8/2005 | Gil et al. |
| 2005/0282087 A1 | 12/2005 | Opower et al. |
| 2006/0132734 A1 | 6/2006 | Luttikhuis et al. |

(Continued)

FOREIGN PATENT DOCUMENTS

WO 2018013270 A1 1/2018

OTHER PUBLICATIONS

PCT International Search Report/Written Opinion dated May 23, 2019 for Application No. PCT/US2019/016601.

*Primary Examiner* — Colin W Kreutzer
(74) *Attorney, Agent, or Firm* — Patterson + Sheridan, LLP

(57) ABSTRACT

Embodiments of the present disclosure generally relate to an image projection system. The image projection system includes an active matrix solid state emitter (SSE) device. The active matrix solid state emitter includes a substrate, a silicon layer, and a emitter substrate. The silicon layer is deposited over the substrate having a plurality of transistors formed therein. The emitter substrate is positioned between the silicon layer and the substrate. The emitter substrate comprises a plurality of emitter arrays. Each emitter array defines a pixel, wherein one pixel comprises one or more transistors from the plurality of transistors. Each transistor is configured to receive a variable amount of current.

19 Claims, 14 Drawing Sheets

(56) References Cited

U.S. PATENT DOCUMENTS

| | | |
|---|---|---|
| 2012/0026478 A1 | 2/2012 | Chen et al. |
| 2012/0249993 A1 | 10/2012 | Kajiyama et al. |
| 2012/0307222 A1* | 12/2012 | Van Zwet ............... G03F 7/704 355/67 |
| 2013/0088704 A1 | 4/2013 | Mei et al. |
| 2014/0071421 A1* | 3/2014 | De Jager ................. G03F 7/704 355/71 |
| 2014/0160452 A1* | 6/2014 | De Jager ............. G03F 7/70375 355/53 |
| 2015/0370177 A1 | 12/2015 | Van Zwet et al. |
| 2016/0266498 A1 | 9/2016 | De Jager et al. |
| 2018/0188655 A1 | 7/2018 | Chen et al. |

* cited by examiner

SPATIAL LIGHT MODULATOR WITH VARIABLE INTENSITY DIODES

BACKGROUND

Field

Embodiments of the present disclosure generally relate to an apparatus for producing an image on a substrate, and more particularly to an improved spatial light modulator.

Description of the Related Art

Photolithography is widely used in the manufacture of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

A conventional microlithography system utilizes a digital micromirror device (DMD) to form a plurality of light beams by reflecting light towards the photoresist. The DMD includes a plurality of mirrors with each mirror of the DMD in either the "on" position or "off" position, constraining the system to the image quality of binary emitters. In order to continue to provide display devices and other devices with a more precise image quality, new apparatuses, approaches, and systems are needed to precisely and cost-effectively create patterns on substrates, such as large area substrates.

As the foregoing illustrates, there is a continual need for an improved technique for precisely and cost-effectively creating patterns on a substrate.

SUMMARY

In one embodiment, an image projection system is disclosed herein. The image projection system includes an active matrix solid state emitter (SSE). The active matrix SSE includes a substrate, a silicon layer, and a emitter substrate. The silicon layer is deposited over the substrate having a plurality of transistors formed therein. The emitter substrate is positioned between the silicon layer and the substrate. The emitter substrate comprises a plurality of emitter arrays. Each emitter array defines a pixel, wherein one pixel comprises one or more transistors from the plurality of transistors. Each transistor is configured to receive a variable amount of current.

In another embodiment, a method for producing an image on a substrate is disclosed herein. Instructions are transmitted to an image projection system. The image projection system comprises a plurality of emitter arrays. The instructions comprise state information for each emitter in the plurality of emitter arrays. The emitters in an on state are pulsed to expose a first portion of the substrate. The substrate is translated a step size. The emitters in the on state are pulsed to expose a second portion of the substrate. The pulsing of the emitters in the on state is repeated after each step size translation to expose subsequent portions of the substrate until the substrate is processed.

DETAILED DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the present disclosure generally relate to an image projection system. One image projection system includes an active matrix solid state emitter (SSE). The active matrix solid state emitter includes a substrate, a silicon layer, and an emitter substrate. The silicon layer is deposited over the substrate having a plurality of transistors formed therein/thereon. The emitter substrate is positioned between the silicon layer and the substrate. The emitter substrate comprises a plurality of emitter arrays. Each emitter array defines a pixel, wherein one pixel comprises two or more transistors from the plurality of transistors. Each transistor is configured to receive a variable amount of current. The intensity of each emitter can be controlled, providing for a gray level control in a pixel addressable system. Embodiments and aspects will be described in more detail below.

Figure 1:
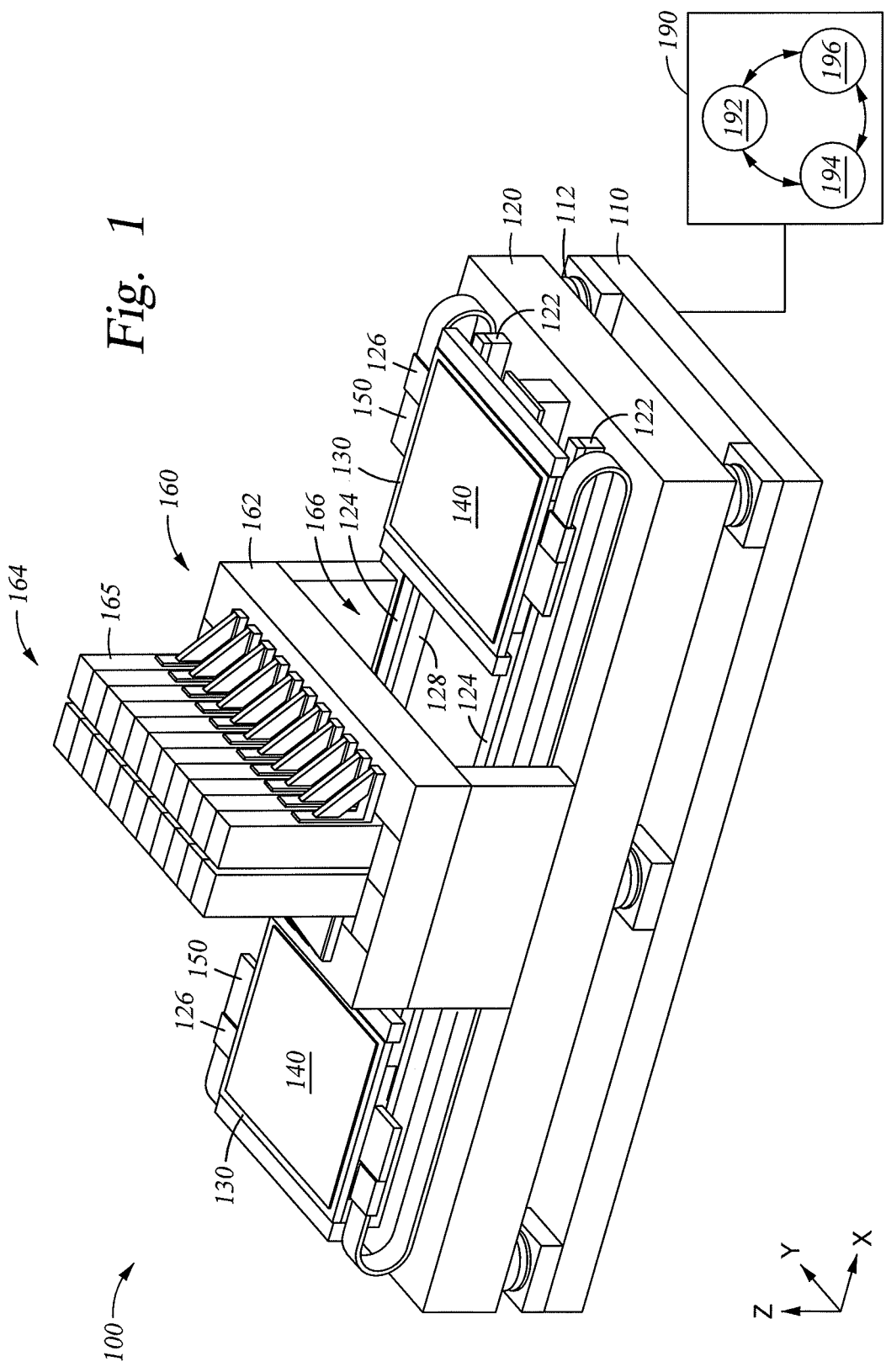
FIG. 1 illustrates a perspective view of a processing system, according to one embodiment.

FIG. 1 is a perspective view of a system 100 that may benefit from embodiments disclosed herein. The system 100 includes a base frame 110, a slab 120, one or more stages 130, and a processing apparatus 160. The base frame 110 rests on the floor of a fabrication facility and supports the slab 120 above the floor. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material used as part of a flat panel display. In other embodiments, the substrate 140 is made of other materials. The substrate 140 has a photoresist layer formed thereon. The photoresist is sensitive to, and reacts when exposed to, at least certain wavelengths of electromagnetic radiation. A positive photoresist includes portions of the photoresist, which when exposed to electromagnetic radiation, will be respectively soluble to photoresist developer applied to the photoresist after a pattern is written into the photoresist using electromagnetic radiation. A negative photoresist includes portions of the photoresist, which when exposed to electromagnetic radiation, will be respectively insoluble to photoresist developer applied to the photoresist after the electromagnetic radiation pattern is written into the photoresist. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. In this manner, a pattern is created on a surface of a photoresist layer on the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, each track 124 of the pair of tracks 124 extends in a straight line path. An encoder 126 is coupled to the stage 130 in order to provide information of the location of the stage 130 to a controller (not shown).

The processing apparatus 160 includes a support 162 and a processing unit 164. The support 162 is disposed on the slab 120 and includes an opening 166 therethrough for the stage 130 to pass under the processing unit 164. The processing unit 164 is supported over the slab 120 by the support 162. In one embodiment, the processing unit 164 is a pattern generator configured to expose photoresist in a photolithography process. In some embodiments, the pattern generator is configured to perform a maskless lithography process. The processing unit 164 includes a plurality of image projection apparatus (shown in FIG. 5). In one embodiment, the processing unit 164 contains as many as 84 image projection apparatuses. Each image projection apparatus is disposed in a case 165. The processing apparatus 160 is useful to perform maskless direct pattern writing to photoresist or other electromagnetic radiation sensitive material.

During operation, the stage 130 moves in the X-direction from a loading position, as shown in FIG. 1, to a processing position. The processing position is one or more positions of the stage 130 as the stage 130 passes under the processing unit 164. During operation, the stage 130 is lifted from the tracks 124 by a plurality of air bearings 202 (shown in FIG. 2) and while elevated from the tracks 124 moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of the stage 130, of each stage, in real time so that each of the plurality of image projection apparatus can accurately locate the patterns being written at the correct location on the photoresist covered substrate. The metrology system also provides a real-time measurement of the angular position of the stage 130 about the vertical or Z-axis. The angular position measurement can be used to hold the angular position of the stage 130 constant during scanning by means of a servo mechanism or it can be used to apply corrections to the positions of the patterns being written on the substrate 140 by the image projection apparatus 270, shown in FIG. 5. These techniques may be used in combination.

Figure 2:
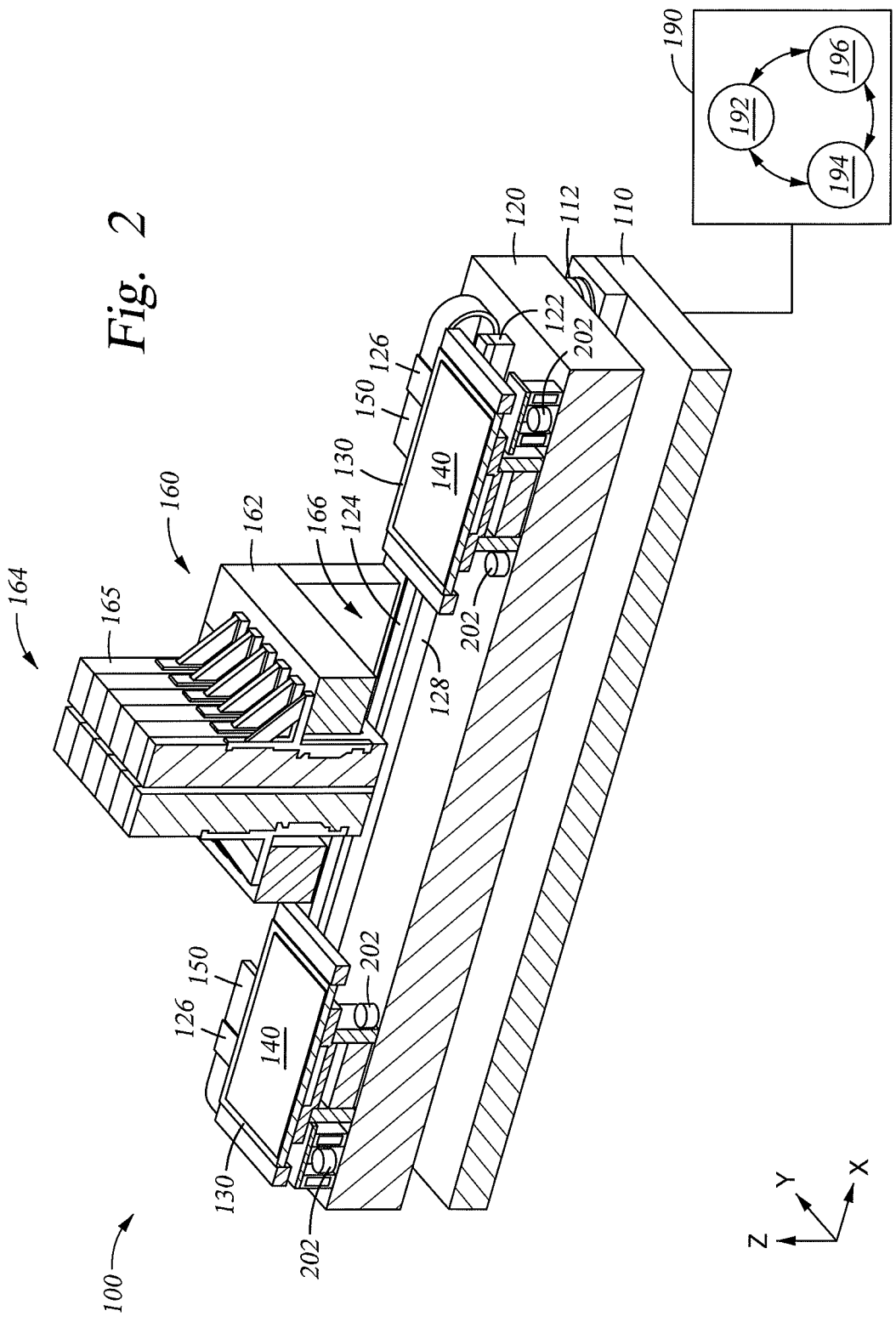
FIG. 2 illustrates a cross-sectional side view of the processing system of FIG. 1, according to one embodiment.

FIG. 2 is a cross-sectional side view of the processing system 100 of FIG. 1, according to one embodiment. As discussed above, each stage 130 includes a plurality of air bearings 202 for lifting the stage 130. Each stage 130 may also include an actuator, such as a motor, for moving the stage 130 along the tracks 124. The two or more stages 130 and the processing apparatus 160 may be enclosed by an enclosure (not shown) in order to provide temperature and pressure control.

The system 100 also includes a controller 190. The controller 190 is generally designed to facilitate the control and automation of the processing techniques described herein. The controller 190 may be coupled to or in communication with one or more of the processing apparatus 160, the stages 130, and the encoder 126. The processing apparatus 160 and the stages 130 may provide information to the controller 190 regarding the substrate processing and the substrate aligning. For example, the processing apparatus 160 may provide information to the controller 190 to alert the controller 190 that substrate processing has been completed.

The controller 190 may include a central processing unit (CPU) 192, memory 194, and support circuits (or I/O) 196. The CPU may be one of any form of computer processors that are used in industrial settings for controlling various processes and hardware (e.g., pattern generators, motors, and other hardware) and monitor the processes (e.g., processing time and substrate position). The memory 194 is connected to the CPU 192, and may be one or more of a readily available memory, such as random access memory (RAM), read only memory (ROM), floppy disk, hard disk, or any other form of digital storage, local or remote. Software instructions and data can be coded and stored within the memory 194 for instructing the CPU 192. The support circuits 196 are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 3:
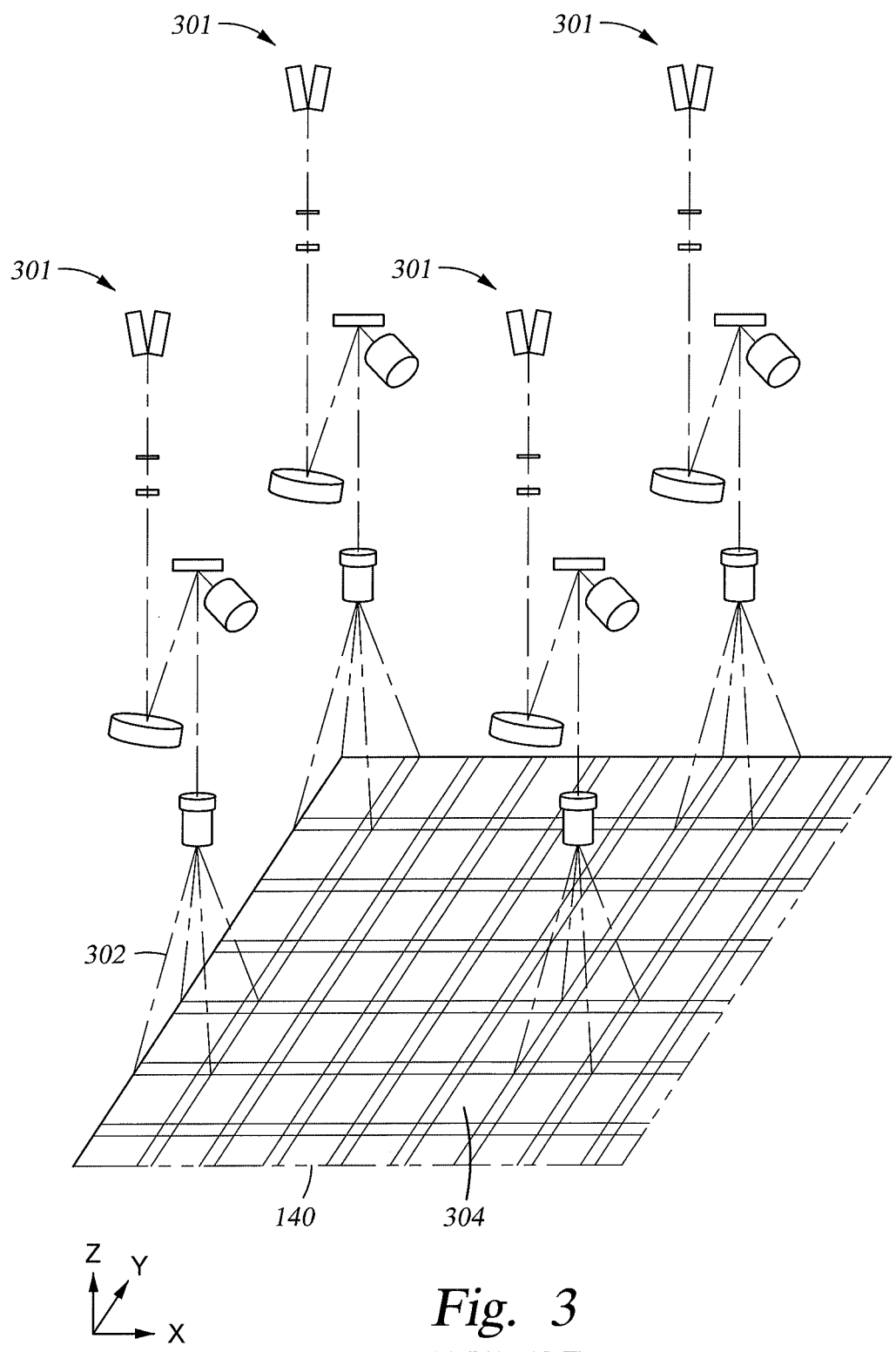
FIG. 3 illustrates a perspective view of a plurality of image projection systems, according to one embodiment.

FIG. 3 is a perspective view of a plurality of conventional image projection systems 301 that may be used in processing system 100 according to one embodiment. As shown in FIG. 3, each image projection system 301 produces a plurality of write beams 302 onto a surface 304 of the substrate 140. As the substrate 140 moves in the x-direction and the y-direction, the entire surface 304 may be patterned by the write beams 302. The number of image projection systems 301 may vary based on the size of the substrate 140 and/or the speed of the stage 130.

Figure 4A:
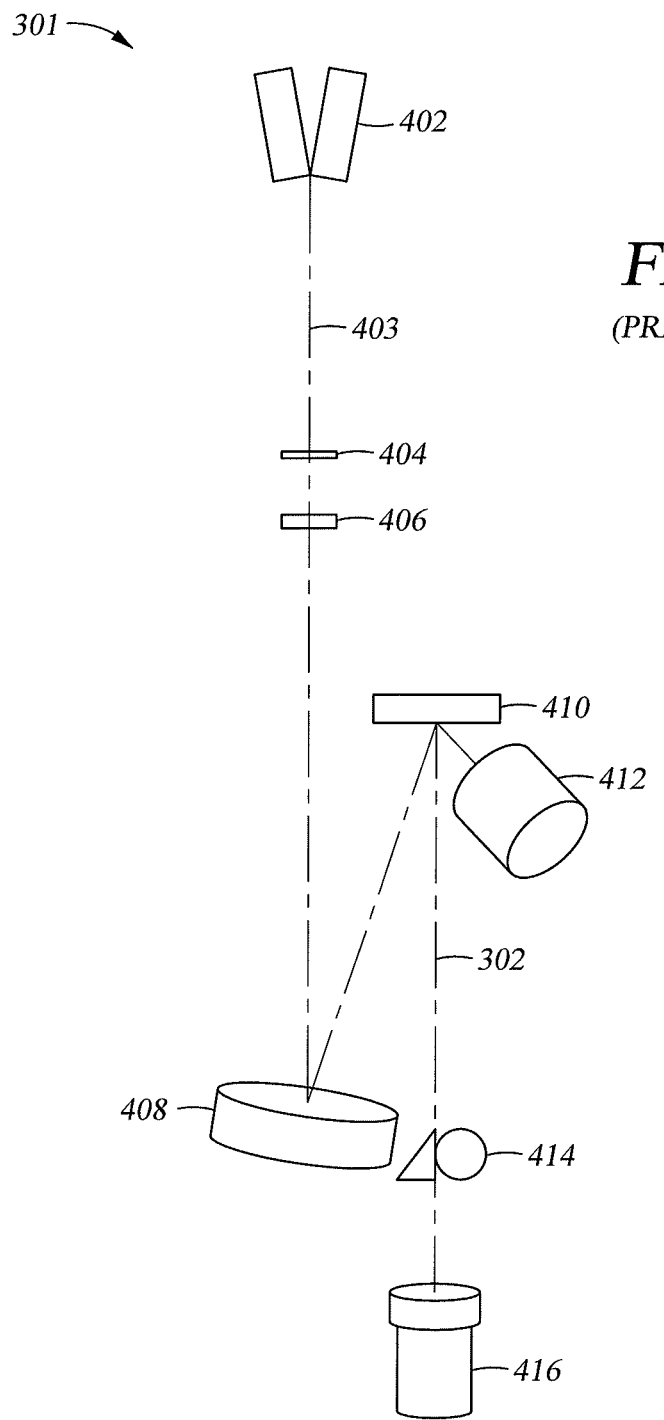
FIG. 4A illustrates a perspective schematic view of one image projection system of the plurality of image projection systems of FIG. 3.

FIG. 4A is a perspective schematic view of one conventional image projection system 301 of the plurality of image projection systems 301 illustrated in FIG. 3 according to one embodiment. The image projection system 301 may one or more light sources 402, an aperture 404, a lens 406, a mirror 408, digital micromirror device (DMD) 410, a light dump 412, a camera 414, and a projection lens 416. The light source 402 may be an LED or a laser. The light source 402 may be capable of producing a light having a predetermined wavelength. In one embodiment, the predetermined wavelength is in the blue or near ultraviolet (UV) range, such as less than about 450 nm. The mirror 408 may be a spherical or other suitable mirror. The projection lens 416 may be a 10× objective lens. The projection lens 416 may alternatively have other magnification.

During operation, a beam 403 having a predetermined wavelength, such as a wavelength in the blue range, is produced by the light source 402. The beam 403 is reflected to the DMD 410 by the mirror 408.

The DMD 410 includes a plurality of mirrors that may be controlled individually, and each mirror of the plurality of mirrors of the DMD may be at an "on" position or "off" position, based on the mask data provided to the DMD by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

Figure 4B:
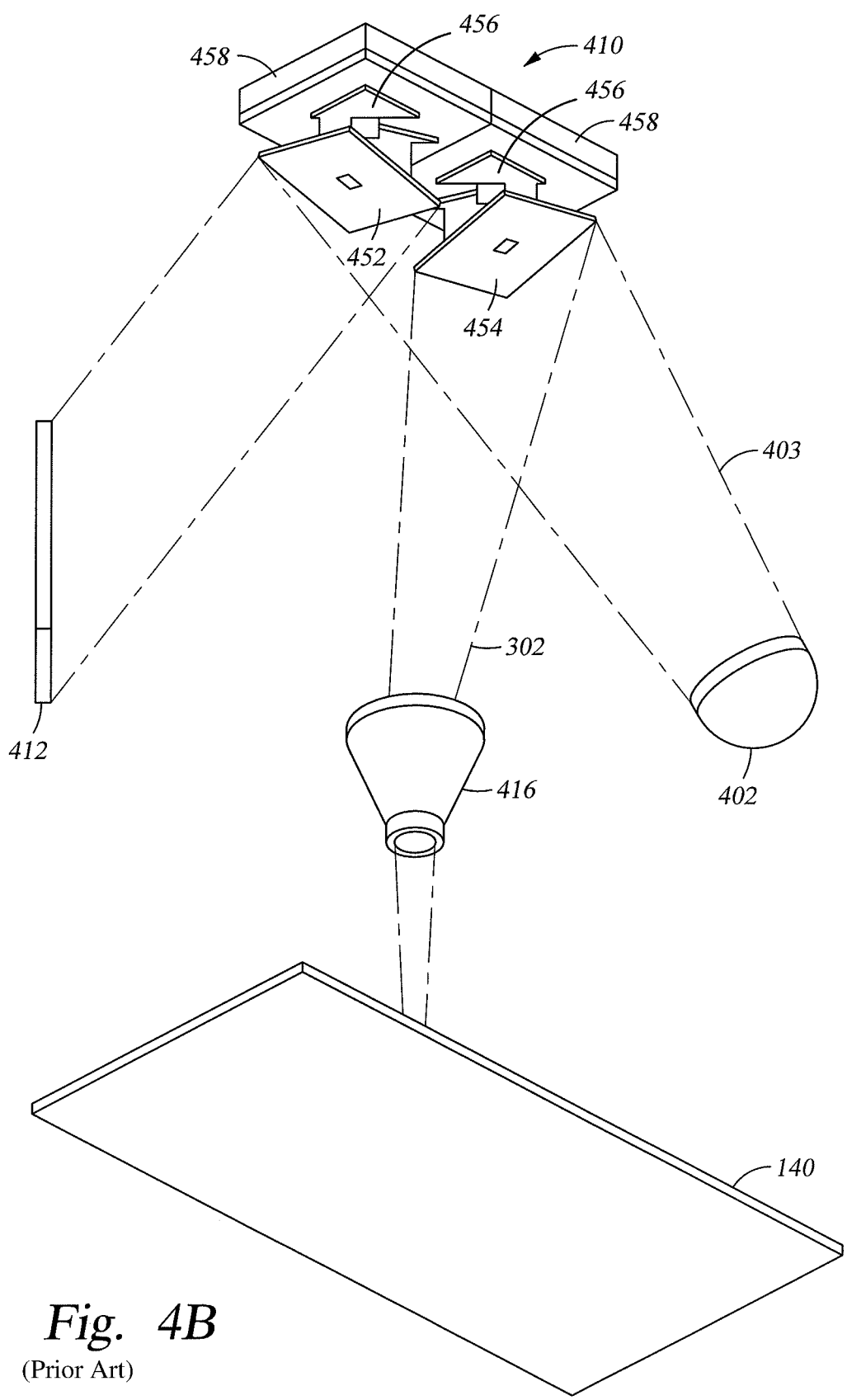
FIG. 4B illustrates a perspective view of a multiple DMD assembly, according to one embodiment.

FIG. 4B illustrates two mirrors 452, 454 of the DMD 410, according to one embodiment. As shown, each mirror 452, 454 of the DMD 410 is disposed on a titling mechanism 456, which is disposed on a memory cell 458. During operation, each mirror 452, 454 is controlled by loading the mask data into the memory cell. The mask data electrostatically controls the titling of the mirror 452, 454 in a binary fashion. When the mirrors 452, 454 are in a reset mode or without power applied, it may be set to a flat position not corresponding to any binary number. Zero in binary may correspond to an "off" position, which means the mirror is tilted at −10 degrees, −12 degrees, or other suitable negative tilting degree. One in binary may correspond to an "on" position, which means that the mirror is titled at +10 degrees, +12 degrees, or other suitable positive tilting degree. As shown in FIG. 4B, the mirror 452 is at "off" position and the mirror 454 is at "on" position.

Current image projection systems, such as image projection system 301, suffer from several limitations. For example, conventional image projection systems are limited in that each mirror in the DMD 410 is only configurable between an "on" state and an "off" state, thus providing only two possible exposures. Additionally, conventional image projection systems are limited in that each mirror in the DMD 410 must be move into place to be in either the "on" or "off" state. For example, during operation, there is a preparation time during which each memory cell 458 for each mirror receives data from a controller to either switch between to either an "on" position or an "off" position. For purposes of this application, the time it takes to transmit instructions to each memory cell 458 is referred to as the "data load" time. In some examples, this may take about 10 microseconds. In addition to the data load time, there is the subsequent time it takes to configure each mirror to an on or off position, i.e., "flip time." Each mirror must be brought into its correct position based on the instructions sent to its respective memory cell 458. In some examples, this takes about 10-15 microseconds. Finally, there is also a duration of time that the system waits for each mirror to settle after each mirror is brought into its correct position, i.e., "settling time." This settling time ensures that there is not a mirror that is shaking or vibrating as a result of the mechanical motion. Thus, for each exposure there is a total preparation time of data load time plus flip time plus settling time. Because each mirror must be configured to a given position and subsequently settled, the only variable that may be improved upon is the data load time, which may be improved with stronger memory cells 458. However, the flip time and the settling time will remain a constraint for conventional image projection systems.

Figure 5:
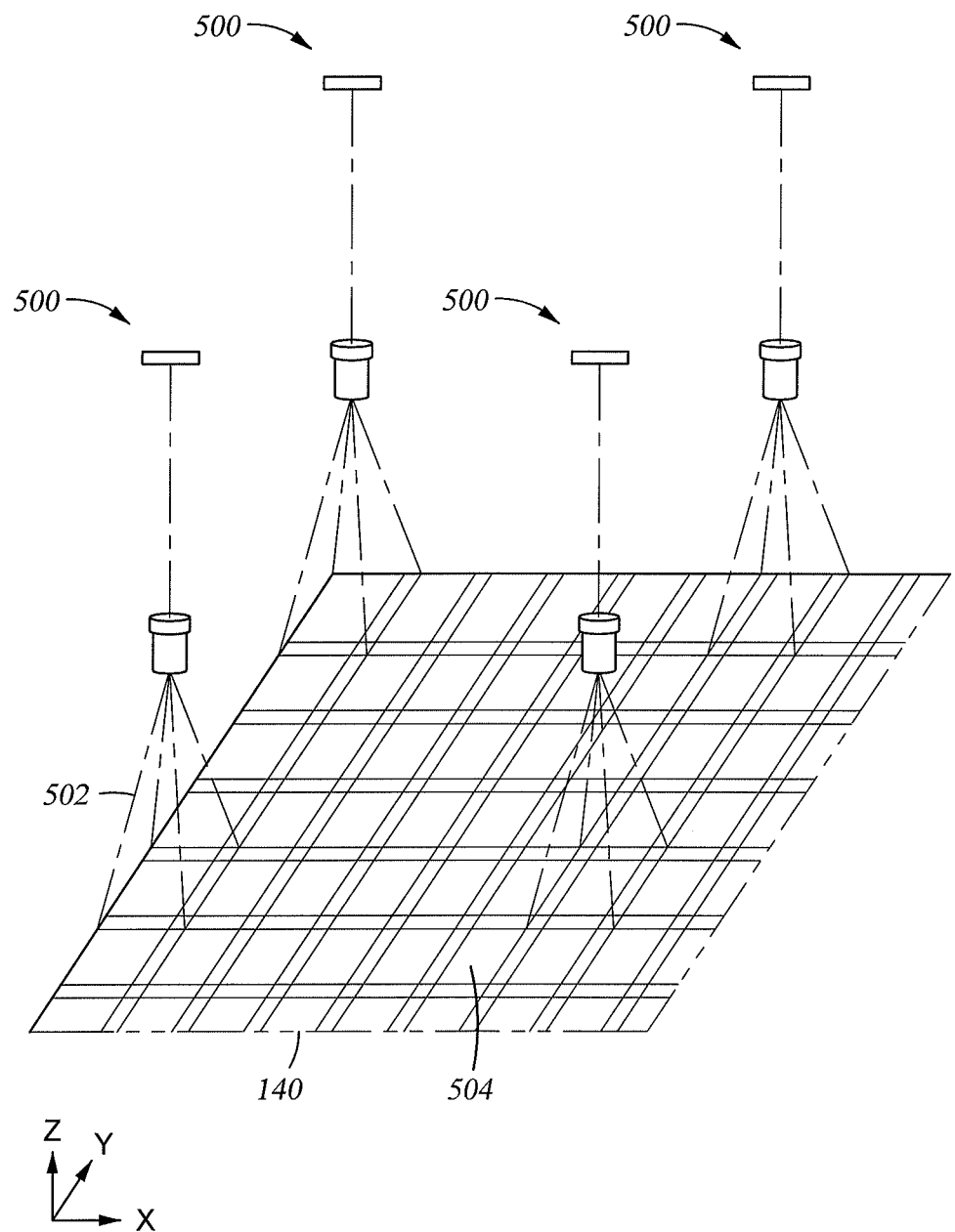
FIG. 5 illustrates a perspective view of a plurality of improved image projection systems, according to one embodiment.

FIG. 5 is a perspective view of a plurality of improved image projection systems 500 for use in the processing system 100 according to one embodiment. As shown in FIG. 5, each image projection system 500 produces a plurality of write beams 502 onto a surface 504 of the substrate 140. As the substrate 140 moves in the x-direction and the y-direction, the entire surface 504 may be patterned by the write beams 502. The number of image projection systems 500 may vary based on the size of the substrate 140 and/or the speed of the stage 130.

Figure 6:
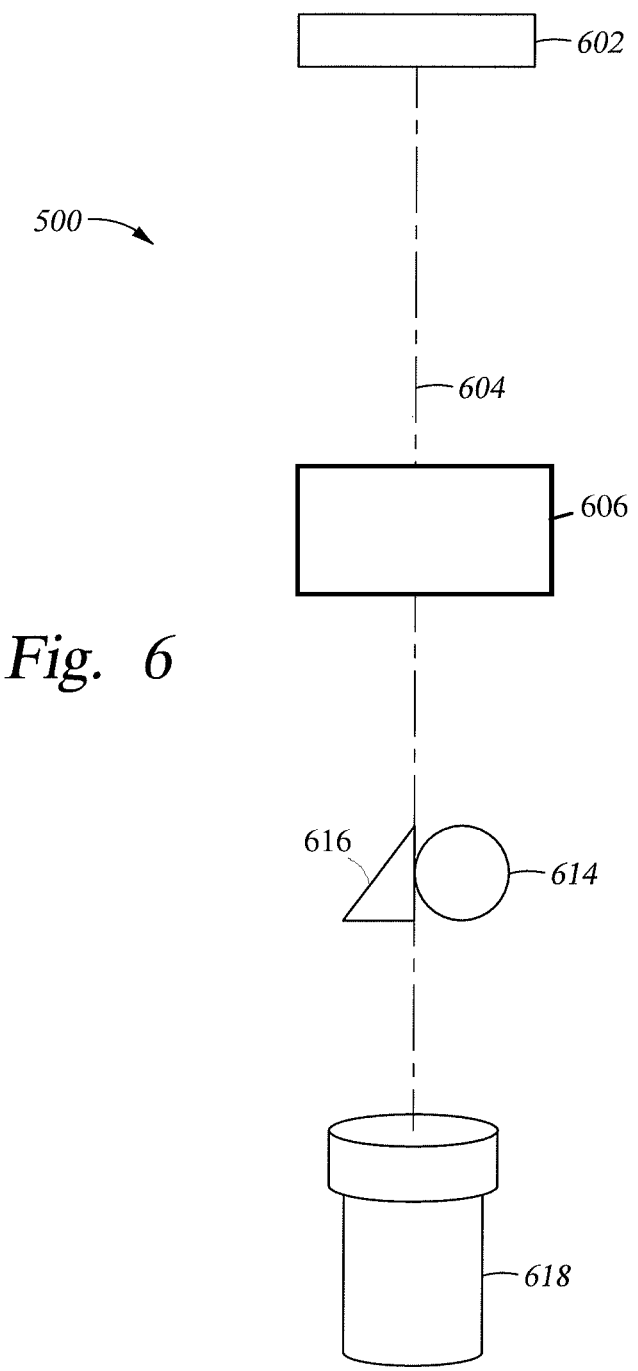
FIG. 6 illustrates a perspective schematic view of one improved image projection system of the plurality of image projection systems of FIG. 5.

FIG. 6 is a perspective schematic view of one improved image projection system 500 of the plurality of image projection systems 500 of FIG. 5 according to one embodiment. The image projection system 500 may include an active matrix solid state emitter display (AMSSE) 602, a camera 614, a focus sensor 616, an optical element 606, and a projection optics 618. The AMSSE 602 includes at least a plurality of emitter elements (discussed and shown below in conjunction with FIG. 7), each emitter element configured to emit radiation 604 towards the substrate 140. An emitter element may be any sufficient element that can emit radiation. In one embodiment, each emitter element is a micro emitter element, such as a diode. Accordingly, the image projection system 500 does not include the conventional mechanical components, such as the DMD 410 of image projection system 301, nor does the image projection system 500 include a separate energy source 402, as each emitter element is its own energy source. In one embodiment, the image projection system 500 is configured to include at least one emitter element that would otherwise have been one mirror in the DMD 410 of conventional image projection systems 301.

In the embodiment shown, the beam 604 is emitted towards the camera 614. The camera 614 and projection optics 618 are similar to camera 414 and projection lens 416 discussed above in conjunction with FIGS. 4A and 4B. In one embodiment, the projection optics 618 is a projection lens. The optical element 606 is disposed between the AMSSE 602 and the camera 614. The optical element 606 provides for field size reduction of the transmitted image to the substrate 140. In one embodiment, the optical element 606 is a lens. The focus sensor 616 may be disposed between the AMSSE 602 and the camera 614. In another embodiment, the focus sensor 616 may be disposed adjacent the camera 614. The focus sensor 616 provides feedback on alignment and inspection of the image projection system 500. In one embodiment, the focus sensor 616 includes one or more radiation sources which are directed through the lens of the camera 614 and then back through the lens of the camera 614 and imaged onto sensors to detect whether the beam spots projected from the radiation sources are in focus at the plane of the photoresist.

Figure 7A:
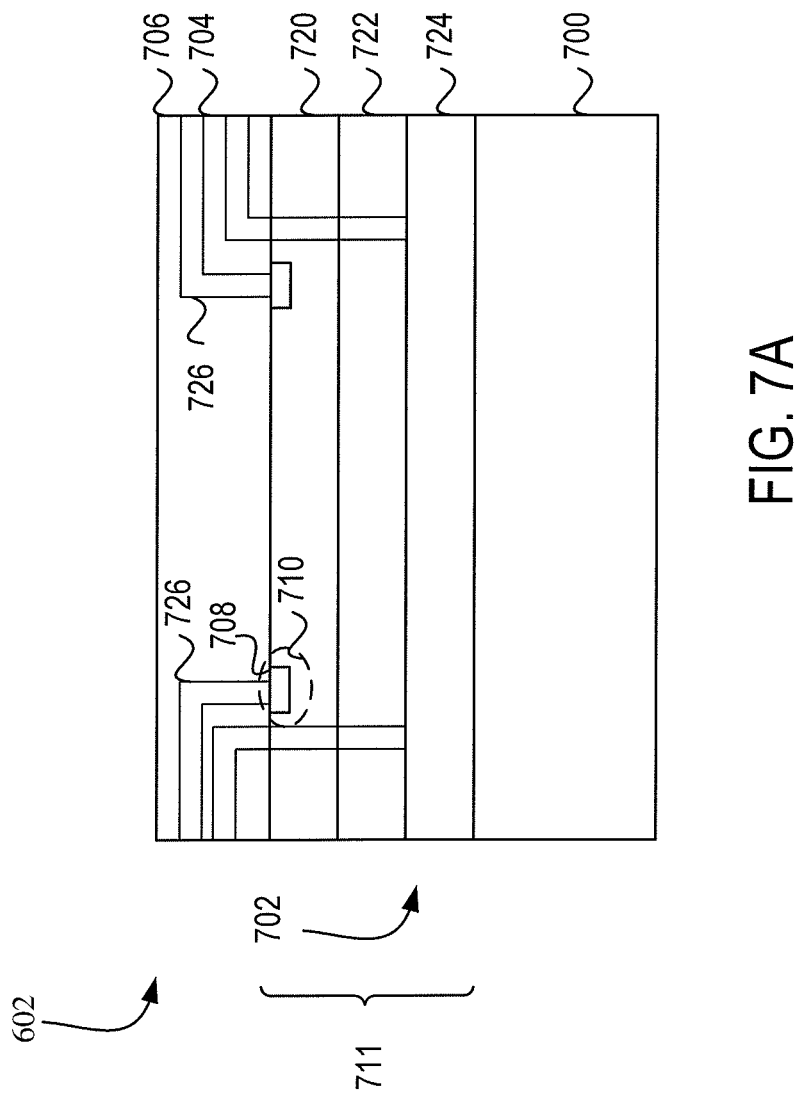
FIG. 7A illustrates a schematic side view of an active matrix radiation emitter, according to one embodiment.

FIG. 7A is a partial cross-sectional view of the AMSSE 602 of FIG. 6, according to one embodiment. The AMSSE 602 may be formed on a substrate 700. In one embodiment, the substrate 700 may be formed of sapphire. A GaN layer 702 is deposited over the substrate 700. A silicon layer 706 is deposited on the GaN layer 702. The GaN layer 702 may include a p-GaN layer 720, an i-GaN layer 722, and an n-GaN layer 724. One or more transistors 704 are formed in the silicon layer 706 through a plurality of contacts 726 extending into the GaN layer 702. A plurality of light modification elements are positioned in the GaN layer 702. Collectively, the plurality of light modification elements and the GaN layer 702 are referred to as an emitter substrate 711. For example, the light modification elements may include a plurality of emitters 708 arranged in rows and columns. Each emitter 708 may be any emitter that is configurable to emit radiation. In one example, each emitter 708 is a micro-emitter. One or more emitters 708, arranged in an array, may define a pixel 710. For example, the emitters 708 may define a 1080p display comprising an of array 1920 pixels by 1080 pixels totaling about 2,073,600 pixels. Each pixel of the 2,073,600 pixels in this example may comprise an array of emitters 708. Continuing with the example, each pixel of the 2,073,600 pixels may correspond to one or more transistors 704 formed in the silicon layer 706. In another example, the emitters 708 may define an ultra-high-definition (UHD) display comprising an array of 3840 pixels by 2160 pixels, totaling 8,294,400 pixels. Generally, the emitters 708 may define any suitable display (e.g., UHD, 1080p, 720p, and the like).

Each emitter 708 is configurable between an "on" state and an "off" state. In the "on" state, each emitter 708 may emit energy. The energy may be any form of electromagnetic radiation. For example, in one embodiment, an electromagnetic radiation having a wavelength within the spectrum between about 300 nm to about 800 nm may be used. In other embodiments, wavelengths outside of this spectrum (e.g., infrared ray, x-ray, and the like) may be used as well. In another embodiment, each emitter 708 of the plurality of emitters 708 has a different wavelength. A controller, such as controller 190, may configure each emitter 708 to either the on state or the off state. Additionally, the controller 190 may also control an amount of current provided to the emitter 708. Because there is no longer a need to mechanically move each emitter 708, as was previously needed by conventional image projection systems using a DMD, the flip time and settling time are eliminated, thus shortening the overall preparation time, and improving throughput. Additionally, the intensity of each emitter 708 may be modulated to control the exposure over time. In traditional image projection systems, each mirror is either in an "on" state or "off" state; there are not any intermediate states therebetween.

Figure 7B:
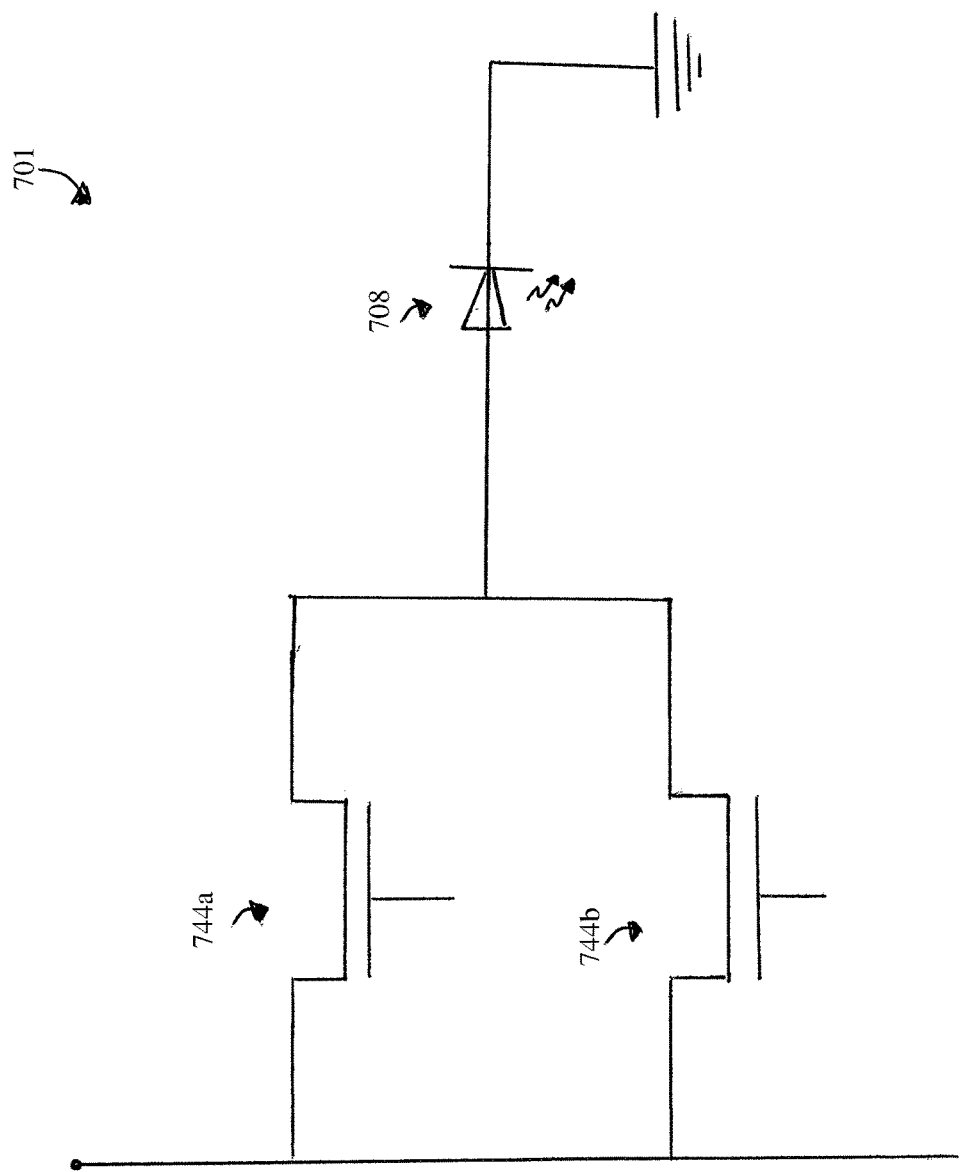
FIG. 7B is a circuit diagram for the AMSSE, according to one embodiment.

FIG. 7B is a circuit diagram 701 for the AMSSE 602, according to one embodiment. The diagram 701 includes a first transistor 744a, a second transistor 744b, and an emitter 708. The emitter 708 receives current from the first transistor 744a and/or the second transistor 744b. In the current example, determining which transistors 744a, 744b are on or off dictates the amount of current applied to the array of emitters corresponding to a pixel. A pixel is configurable to display various shades of grey depending on the current received by the emitter. In one embodiment, each transistor is configured to receive between X and 2X amps of current. In one embodiment, the possible amounts of current provided to the array of emitters 708 corresponding to pixel are: 3X amps (both transistors on), 2X amps (one transistor on), X (one transistor on), and 0 amps (both transistors off). The amount of current a transistor can receive depends upon the width of the gate within that transistor such that the wider the width of the gate the more current is able to pass. In one embodiment, transistor 744a is on and configured to receive X amps of current, and transistor 744b is on and configured to receive 2X amps of current, totaling 3X amps of total current applied to the array of emitters 708 which corresponds to a first brightness of the pixel. In another embodiment, transistor 744a is turned off and transistor 744b is turned on receiving 2X amps of current, totaling 2X amps of total current applied to the array of emitters which corresponds to a second brightness of the pixel. In yet another embodiment, transistor 744a is turned on and receives X amps of current while transistor 744b is turned off, totaling X amps of total current applied to the array of emitters which corresponds to a third brightness of the pixel. In other embodiments, each transistor may be configured to receive a varying amount of current. Generalizing the previous examples, each pixel may be configured to display 2n+1 shades of grey, where n represents the number of transistors corresponding to the pixel. Thus, the AMSSE 602 is able to obtain a per-pixel grey scale providing for a grey level control in a pixel addressable photolithography system. In another embodiment, each emitter may emit a different wavelength such that a color scale instead of a gray level scale is produced.

Figure 7C:
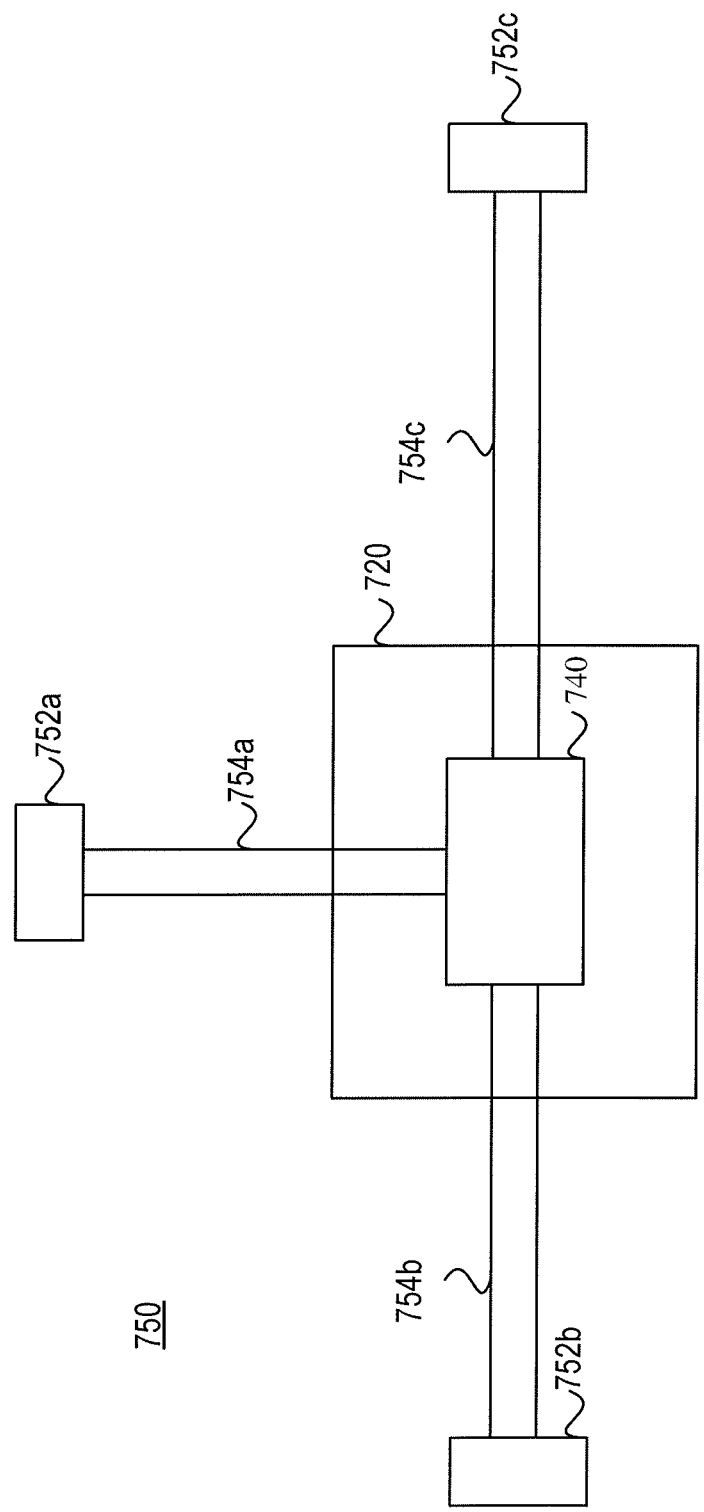
FIG. 7C is a diagram illustrating one configuration for the AMSSE, according to one embodiment.

FIG. 7C is a diagram 750 illustrating one configuration for the AMSSE 602, according to one embodiment. As shown, there is a single metal contact 740 formed in the p-GaN layer 720 which is in electrical communication with the emitter 708. The diagram 750 includes three transistors, 752a, 752b, and 752c. Transistor 752a is coupled to the metal contact 740 via a connection line 754a. Transistor 752b is coupled to the metal contact 740 via a connection line 754b. Transistor 752c is coupled to the metal contact 740 via a connection line 754c. All transistors 752a-752c are in electrical contact with the metal contact 740. Accordingly, each transistor 752a-752c may provide a variable amount of signal to the metal contact 740. For example, the variable amount of signal provided to the metal contact 740 may be a variable amount of voltage, variable amount of current, or a variable amount in a high/low electrical line. For example, transistor 752a is configured to provide 100 mA of current; transistor 752b is configured to provide 200 mA of current; transistor 752c is configured to provide 400 mA of current.

Controller 190 selectively turns on/off each transistor 752a-752c. In one example, controller 190 only turns on transistor 752a such that current may flow to the metal contact. Continuing with the above example, with only transistor 752a in an on position, metal contact 740 receives 100 mA of current. In another example, controller 190 turns on transistor 752b and 752c such that current flows from transistor 752b to metal contact 740 and from transistor 752c to metal contact 740. Accordingly, transistors 752b and 752c provide a total current of 500 mA to metal contact 740.

Figure 7D:
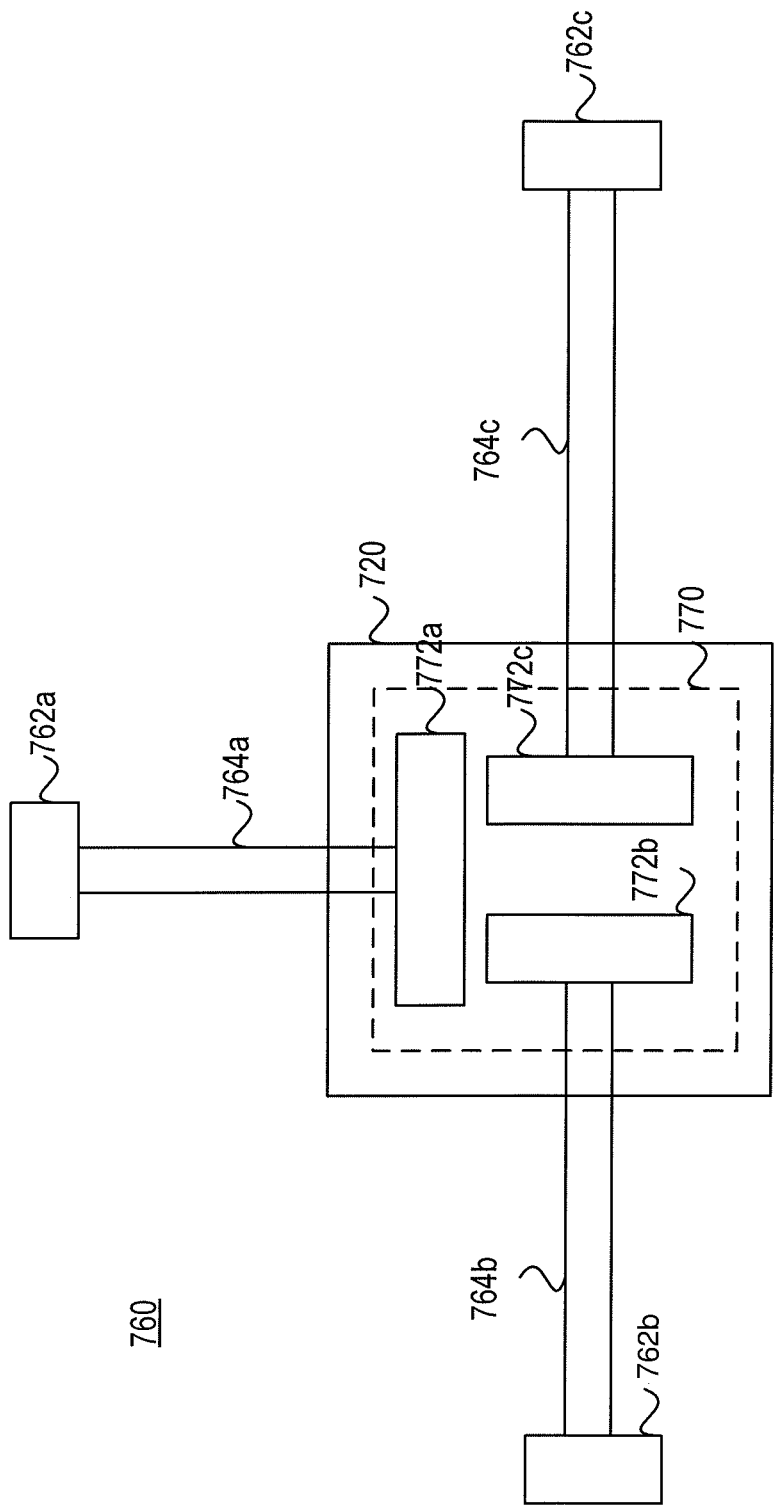
FIG. 7D is a diagram illustrating one configuration for the AMSSE, according to another embodiment.

FIG. 7D is a diagram 760 illustrating one configuration for the AMSSE 602, according to one embodiment. As shown, there is a metal contact area 770 defined in the p-GaN layer 720. A plurality of metal contacts 772a-772c are formed in the metal contact area 770. For example, metal contact 772a, 772b, and 772c are positioned in the metal contact area 770. The diagram 760 further includes three transistors, 762a, 762b, and 762c. Transistor 762a is coupled to the metal contact 772a via a connection line 764a. Transistor 762b is coupled to the metal contact 772b via a connection line 764b. Transistor 762c is coupled to the metal contact 772c via a connection line 764c. All transistors 762a-762c are in electrical contact with the metal contact 740. Accordingly, each transistor 762a-762c may provide a variable amount of signal to its respective metal contact 772a-772c. For example, transistor 762a is configured to provide 100 mA of current to metal contact 772a; transistor 762b is configured to provide 200 mA of current to metal contact 772b; transistor 762c is configured to provide 400 mA of current to metal contact 772c. Although metal contact area 770 includes a plurality of metal contacts 772a-772c, the metal contacts 772a-772c are optically seen as a single emitter, and thus, allow for variable current.

Controller 190 selectively turns on/off each transistor 762a-762c. In one example, controller 190 only turns on transistor 762a such that current may flow to the contact 772a. Continuing with the above example, with only transistor 762a in an on position, metal contact 772a receives 100 mA of current. In another example, controller 190 turns on transistor 762b and 762c such that current flows from transistor 762b to metal contact 772b and from transistor 762c to metal contact 772c. Accordingly, transistors 762b and 762c provide a total current of 500 mA to metal contact area 770.

Figure 8:
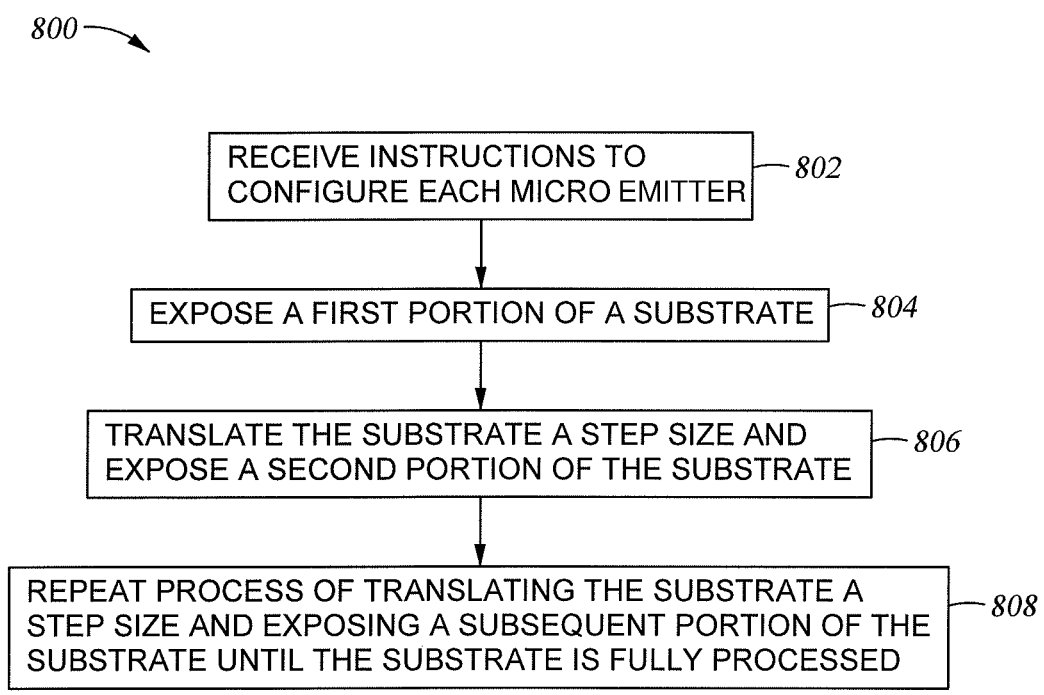
FIG. 8 illustrates a method of producing an image on a substrate using the improved image projection system of FIG. 6.

FIG. 8 is a method 800 of exposing a substrate with an improved image projection system, such as that disclosed in FIGS. 5-7B above, according to one embodiment. The method begins at block 802. At block 802, AMSSE 602 receives instructions from controller 190 that includes an exposure pattern. For example, controller 190 instructs AMSSE 602 regarding which emitters should be in the "on" position, i.e., controller 190 instructs AMSSE 602 regarding which emitters 708 will be on or off, based on the received exposure pattern. For example, controller 190 may create a shape of emitters 708 by selectively choosing which emitters 708 may be turned on or off. The shape of emitters 708 refers to a pattern of which emitters 708 are turned to the "on" state for exposure processes. Continuing with the example, given an n×m emitter arrangement, controller 190 may selectively turn on a 100×20 subset of the n×m emitters 708 to obtain an elongated rectangle. In another example controller may selectively turn on emitters 708 to obtain a circular pattern, or other desired pattern. Essentially, a user may change a shape of the radiation emitted from the AMSSE 602 without having to change the arrangement of the emitters 708 in the AMSSE 602.

At block 804, a first portion of a substrate 140 is exposed. Exposing the substrate 140 may form a pattern on the substrate 140 to expose a photoresist on the substrate 140. Each exposure may last between approximately about 2 microseconds and about 85 microseconds, for example between about 5 microseconds and about 75 microseconds. For example, the controller may pulse each emitter in the on state to expose the first portion of the substrate 140. A pulse may be defined as having a starting point and an end point, where the starting point and end point has a duration therebetween. For example, the duration may be as short as a few microseconds or shorter to as long as a period of days or longer.

At block 806, the substrate 140 is translated a step size, and a second portion of the substrate 140 is exposed. Each exposure may last between approximately about 2 microseconds and about 85 microseconds, for example between about 5 microseconds and about 75 microseconds. For example, the controller may pulse each emitter 708 in the on state to expose the first portion of the substrate 140. In some embodiments, rather than the substrate 140 being translated a step size, the AMSSE 602 may be translated a step size, while the substrate 140 remains stationary.

At block 808, the process of translating the substrate a step size and exposing a second portion to a second shot of electromagnetic radiation is repeated until the substrate is fully processed. Each exposure may generate a data set relating to graphical objects patterned on the substrate 140. Each data set may be stored in the memory of the controller. Each data set may be combined to form the image pattern on the substrate 140. Each exposure may form an aerial image of a portion of the substrate 140.

Figure 9:
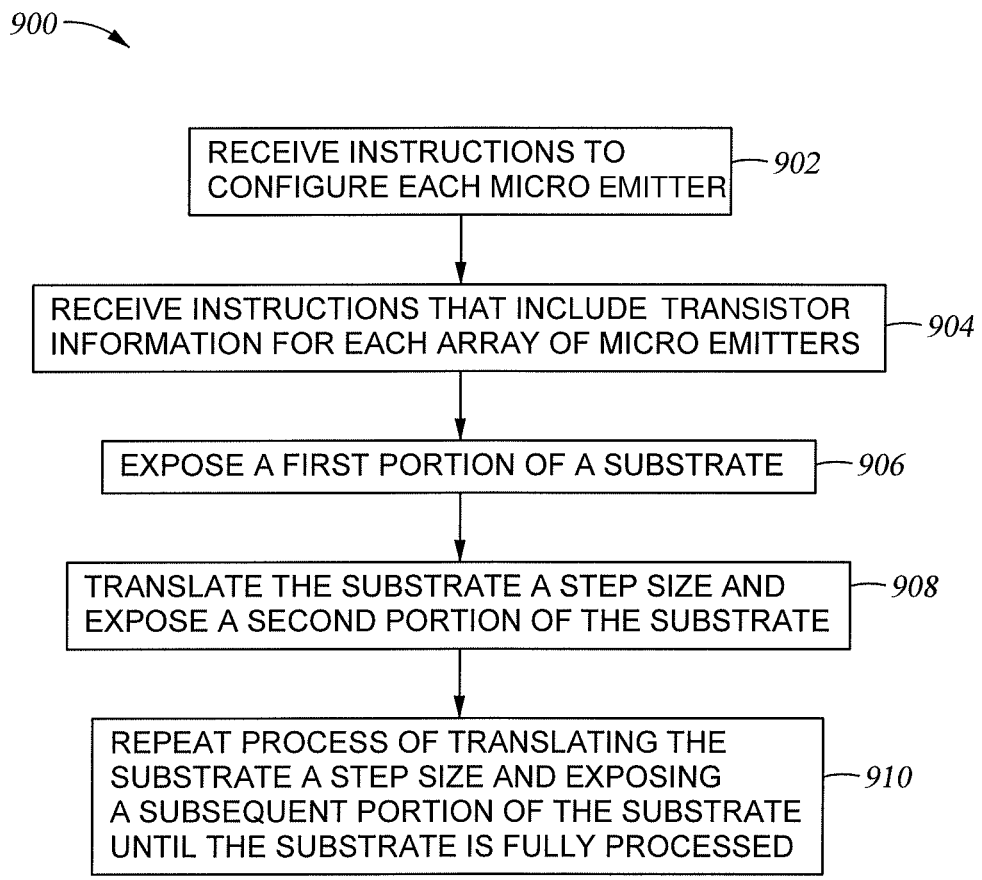
FIG. 9 illustrates a method of producing an image on a substrate using the improved image projection system of FIG. 6.

FIG. 9 is a method 900 of exposing a substrate with an improved image projection system, such as that disclosed in FIGS. 5-7B above, according to one embodiment. The method begins at block 902. At block 902, AMSSE 602 receives instructions from controller 190 that includes an exposure pattern. For example, controller 190 instructs AMSSE 602 regarding which emitters 708 will be in the "on" position, i.e., controller 190 instructs AMSSE 602 regarding which emitters 708 will be on or off, based on the received exposure pattern. For example, controller 190 may create a shape of emitters 708 by selectively choosing which emitters 708 may be turned on or off. The shape of emitters refers to a pattern of which emitters 708 are turned to the "on" state for exposure processes. Continuing with the example, given an n×m emitter 708 arrangement, controller 190 may selectively turn on a 100×20 subset of the n×m emitters 708 to obtain an elongated rectangle. In another example controller may selectively turn on emitters 708 to obtain a circular pattern, or other desired pattern. Essentially, a user may change a shape of the radiation emitted from the AMSSE 602 without having to change the arrangement of the emitters 708 in the AMSSE 602.

At block 904, AMSSE 602 receives instructions from controller 190 that include transistor information for each array of emitters 708. For example, given a first set of transistors for a first array of emitters 708 defining a first pixel, AMSSE 602 receives instructions regarding which transistors are turned on and which transistors are turned off. Using a specific example, when for a set of three transistors associated with a first array of emitters 708 defining the first pixel, assuming that instructions were sent that all three transistors would be turned on, the first pixel would be able to display $2^3=8$ shades of grey.

At block 906, a first portion of a substrate 140 is exposed. Exposing the substrate 140 may form a pattern on the substrate 140 to expose a photoresist on the substrate 140. Each exposure may last between approximately about 2 microseconds and about 85 microseconds, for example between about 5 microseconds and about 75 microseconds. For example, the controller may pulse each emitter 708 in the on state to expose the first portion of the substrate 140.

At block 908, the substrate 140 is translated a step size, and a second portion of the substrate 140 is exposed. Each exposure may last between approximately about 2 microseconds and about 85 microseconds, for example between about 5 microseconds and about 75 microseconds. For example, the controller may pulse each emitter 708 in the on state to expose the first portion of the substrate 140. In some embodiments, rather than the substrate 140 being translated a step size, the AMSSE 602 may be translated a step size, while the substrate 140 remains stationary.

At block 910, the process of translating the substrate a step size and exposing a second portion to a second shot of electromagnetic radiation is repeated until the substrate is fully processed. Each exposure may generate a data set relating to graphical objects patterned on the substrate 140. Each data set may be stored in the memory of the controller. Each data set may be combined to form the image pattern on the substrate 140. Each exposure may form an aerial image of a portion of the substrate 140.

Figure 10:
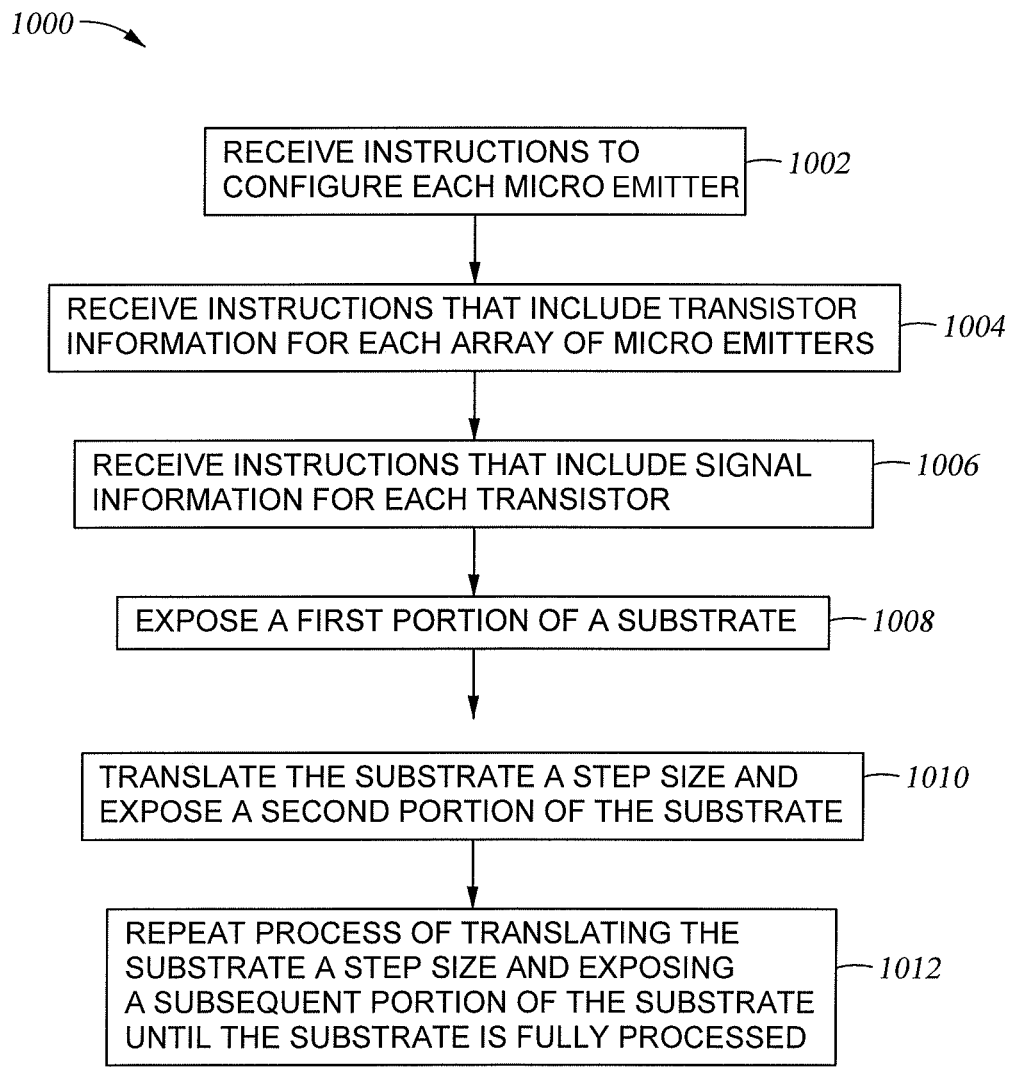
FIG. 10 illustrates a method of producing an image on a substrate using the improved image projection system of FIG. 6.

FIG. 10 is a method 1000 of exposing a substrate with an improved image projection system, such as that disclosed in FIGS. 5-7B above, according to one embodiment. The method begins at block 1002. At block 1002, AMSSE 602 receives instructions from controller 190 that includes an exposure pattern. For example, controller 190 instructs AMSSE 602 regarding which emitters 708 will be in the "on" position, i.e., controller 190 instructs AMSSE 602 regarding which emitters 708 will be on or off, based on the received exposure pattern. For example, controller 190 may create a shape of emitters 708 by selectively choosing which emitters 708 may be turned on or off. The shape of emitters refers to a pattern of which emitters 708 are turned to the "on" state for exposure processes. Continuing with the example, given an n×m emitter 708 arrangement, controller 190 may selectively turn on a 100×20 subset of the n×m emitters 708 to obtain an elongated rectangle. In another example controller may selectively turn on emitters 708 to obtain a circular pattern, or other desired pattern. Essentially, a user may change a shape of the radiation emitted from the AMSSE 602 without having to change the arrangement of the emitters 708 in the AMSSE 602.

At block 1004, AMSSE 602 receives instructions from controller 190 that include transistor information for each array of emitters 708. For example, given a first set of transistors for a first array of emitters 708 defining a first pixel, AMSSE 602 receives instructions regarding which transistors are turned on and which transistors are turned off. Using a specific example, when for a set of three transistors associated with a first array of emitters 708 defining the first pixel, assuming that instructions were sent that all three transistors would be turned on, the first pixel would be able to display $2^3=8$ shades of grey.

At block 1006, AMSSE 602 receives instructions from controller 190 that include signal information for each transistor in block 1004. For example the signal information may include an amount of current, voltage or variable "on" state information that will be supplied to or through each transistor. In one embodiment the variable intensity in each emitter is selected a multiple of a base current x. In another embodiment the variable intensity in each emitter is selected from the group consisting of x, 2x, and 3x. Using a specific example, for the set of three transistors discussed in block 1004, instructions may include 450 mA of current pulled by the emitter, 300 mA pulled by the same emitter, and 0 mA pulled by the same emitter. In this way, an emitter may be modulated to have different shades of grey. Accordingly, each pixel may be driven to deliver variable brightness.

At block 1008, a first portion of a substrate 140 is exposed. Exposing the substrate 140 may form a pattern on the substrate 140 to expose a photoresist on the substrate 140. Each exposure may last between approximately about 2 microseconds and about 85 microseconds, for example between about 5 microseconds and about 50 microseconds. For example, the controller may pulse each emitter in the on state to expose the first portion of the substrate 140.

At block 1010, the substrate 140 is translated a step size, and a second portion of the substrate 140 is exposed. Each exposure may last between approximately about 2 microseconds and about 85 microseconds, for example between about 5 microseconds and about 75 microseconds. For example, the controller may pulse each emitter in the on state to expose the first portion of the substrate 140. In one embodiment each emitter is pulsed for a duration between 1 nanosecond to 50 microseconds in the on state to expose a first portion of the substrate.

In some embodiments, rather than the substrate 140 being translated a step size of 5 mm or lower, the AMSSE 602 may be translated a step size, while the substrate 140 remains stationary.

At block 1012, the process of translating the substrate a step size and exposing a second portion to a second shot of electromagnetic radiation is repeated until the substrate is fully processed. Each exposure may generate a data set relating to graphical objects patterned on the substrate 140. Each data set may be stored in the memory of the controller. Each data set may be combined to form the image pattern on the substrate 140. Each exposure may form an aerial image of a portion of the substrate 140.

By allowing variable brightness per pixel, the improved image projection system may be used for improved lithographic control compared to previously used DMD based tools. For example, by leveraging selective brightness of pixels, the improved image projection system can better control uniformity across the substrate to be exposed. In a specific embodiment, an end user may calibrate the drive signal of columns to have varying brightness to correct any long range brightness variation across the substrate.

In another example, the improved image projection system allows an end user to have per pixel level control by providing a different signal to each pixel to create a greyscale effect. This can aid in controlling lithography feature edge placement. Additionally, such capabilities aids in preventing an orthogonal address grid from stair-casing diagonal lines across the substrate. With per pixel brightness control, the end user can control the "dose" in such a way as to prevent stair-casing lines when the substrate is exposed by varying the amount of radiation emitted from each pixel.

In another example, different doses may be delivered to different areas of the substrate so that after resist development, the resist is patterned to two different depths. In a specific example, in which the substrate is etched to different depths, delivering two different doses can result in a dual damascene pattern from in a single lithography step by driving the pixel dosages to two different levels.

In another example, the improved image projection system may be used in printing swaths, in which the end user needs to make sure that the stitching between consecutive swaths is blended. This may be used by fading the dose of the pixel from 100% to 0%.

While the foregoing is directed to embodiments of the present disclosure, other and further embodiments of the disclosure may be devised without departing from the basic scope thereof, and the scope thereof is determined by the claims that follow.

What is claimed is:

1. A method for producing an image on a substrate, comprising:
    transmitting instructions to an image projection system comprising a plurality of emitter arrays, wherein the instructions comprise state information for each emitter in the plurality of emitter arrays;
    pulsing the emitters for a duration from about 1 nanosecond to about 50 microseconds in an on state to expose a first portion of the substrate;
    translating the substrate a step size of about 5 mm while working in a scanning mode and pulsing the emitters in the on state to expose a second portion of the substrate; and
    repeating pulsing the emitters in the on state to expose subsequent portions of the substrate until the substrate is processed.

2. The method of claim 1, wherein transmitting instructions to an image projection system comprising a plurality of emitter arrays, wherein the instructions comprise state information for each emitter in the plurality of emitter arrays, comprises:
    determining a number of pixels for exposure; and
    configuring each emitter in one or more arrays of emitters that correspond to the number of pixels for exposure.

3. The method of claim 2, wherein configuring each emitter in one or more arrays of emitters that correspond to the number of pixels for exposure comprises:
    selectively providing an input to at least one transistor to each emitter in at least one array of emitters to create a variable intensity in each emitter.

4. The method of claim 3, wherein the variable intensity in each emitter is selected from a multiple of a base current x.

5. The method of claim 1, wherein transmitting instructions to an image projection system comprising a plurality of emitter arrays, wherein the instructions comprise state information for each emitter in the plurality of emitter arrays, comprises:
    creating a pattern of emitter arrays by selectively turning emitters to an on state.

6. The method of claim 5, wherein a first amount of signal is delivered to a first array of emitters and a second amount of signal is delivered to a second array of emitters.

7. A system for producing an image on a substrate, comprising:
    a controller in communication with the system, the controller having a processor and a memory having instructions stored thereon, which, when executed by the processor, performs an operation of producing an image on a substrate, the operation comprising:
        transmitting instructions to the system comprising a plurality of emitter arrays, wherein the instructions comprise state information for each emitter in the plurality of emitter arrays;
        pulsing the emitters for a duration from about 10 nanoseconds to about 50 microseconds in an on state to expose a first portion of the substrate;
        translating the substrate a step size of about 5 mm while working in a scanning mode and pulsing the emitters for a duration from about 1 nanosecond to about 50 microseconds in the on state to expose a second portion of the substrate; and
        repeating pulsing the emitters in the on state to expose subsequent portions of the substrate until the substrate is processed.

8. The system of claim 7, wherein transmitting instructions to an image projection system comprising a plurality of emitter arrays, wherein the instructions comprise state information for each emitter in the plurality of emitter arrays, comprises:
    determining a number of pixels for exposure; and
    configuring each emitter in one or more arrays of emitters that correspond to the number of pixels for exposure.

9. The system of claim 7, wherein transmitting instructions to an image projection system comprising a plurality of emitter arrays, wherein the instructions comprise state information for each emitter in the plurality of emitter arrays, comprises:
    creating a pattern of emitter arrays by selectively turning emitters to an on state.

10. The system of claim 7,
    wherein a first amount of signal is delivered to a first array of emitters and a second amount of signal is delivered to a second array of emitters.

11. The system of claim 7, wherein the instructions comprise state information for each emitter in the plurality of emitter arrays includes a dose information for each array of emitters, wherein the dose information includes an amount of signal delivered to each array of emitters.

12. A non-transitory computer readable medium having instructions stored thereon, which, when executed by a processor, cause the processor to perform a method of producing an image on a substrate, comprising:
    transmitting instructions to an image projection system comprising a plurality of emitter arrays, wherein the instructions comprises state information for each emitter in the plurality of emitter arrays;
    pulsing the emitters for a duration for about 1 nanosecond to about 50 microseconds in an on state to expose a first portion of the substrate;
    translating the substrate a step size of about 5 mm while working in a scanning mode and pulsing the emitters for a duration for about 1 nanosecond to about 50 microseconds in the on state to expose a second portion of the substrate; and
    repeating pulsing the emitters in the on state to expose subsequent portions of the substrate until the substrate is processed.

13. The non-transitory computer readable medium of claim 12, wherein transmitting instructions to an image projection system comprising a plurality of emitter arrays, wherein the instructions comprise state information for each emitter in the plurality of emitter arrays, comprises:
    determining a number of pixels for exposure; and configuring each emitter in one or more arrays of emitters that correspond to the number of pixels for exposure.

14. The non-transitory computer readable medium of claim 12, wherein transmitting instructions to an image projection system comprising a plurality of emitter arrays, wherein the instructions comprise state information for each emitter in the plurality of emitter arrays, comprises:
   creating a pattern of emitter arrays by selectively turning emitters to an on state.

15. The non-transitory computer readable medium of claim 12, wherein the instructions comprise state information for each emitter in the plurality of emitter arrays includes a dose information for each array of emitters, wherein the dose information includes an amount of signal delivered to each array of emitters.

16. The method of claim 6, wherein the first amount of signal is a first amount of current and the second amount of signal is a second amount of current.

17. The system of claim 10, wherein the first amount of signal is a first amount of current and the second amount of signal is a second amount of current.

18. The non-transitory computer readable medium of claim 12, wherein a first amount of signal is delivered to a first array of emitters and a second amount of signal is delivered to a second array of emitters.

19. The non-transitory computer readable medium of claim 18, wherein the first amount of signal is a first amount of current and the second amount of signal is a second amount of current.

* * * * *